(12) United States Patent
Arai et al.

(10) Patent No.: US 7,132,220 B2
(45) Date of Patent: Nov. 7, 2006

(54) ORGANOSILOXANE POLYMER, PHOTO-CURABLE RESIN COMPOSITION, PATTERNING PROCESS, AND SUBSTRATE PROTECTIVE FILM

(75) Inventors: Kazuhiro Arai, Gunma-ken (JP); Hideto Kato, Gunma-ken (JP); Satoshi Asai, Gunma-ken (JP)

(73) Assignee: Shih-Etsu Chemical Co., Ltd., Tokyo (JP)

( * ) Notice: Subject to any disclaimer, the term of this patent is extended or adjusted under 35 U.S.C. 154(b) by 7 days.

(21) Appl. No.: 10/752,513

(22) Filed: Jan. 8, 2004

(65) Prior Publication Data
US 2004/0142276 A1 Jul. 22, 2004

(30) Foreign Application Priority Data
Jan. 10, 2003 (JP) ............................. 2003-003969
Jan. 23, 2003 (JP) ............................. 2003-014274

(51) Int. Cl.
*G03F 7/075* (2006.01)
*C08G 77/20* (2006.01)

(52) U.S. Cl. ................ 430/287.1; 430/270.1; 430/325; 528/12; 528/13; 528/15; 528/31; 528/32; 528/479; 522/99

(58) Field of Classification Search ........... 430/270.1, 430/287.1, 325; 528/12, 13, 15, 25, 31, 32, 528/479; 525/479; 522/99
See application file for complete search history.

(56) References Cited

U.S. PATENT DOCUMENTS

| 3,159,601 | A |  | 12/1964 | Ashby ........................... 528/15 |
| 3,159,662 | A |  | 12/1964 | Ashby ........................... 528/15 |
| 3,220,972 | A |  | 11/1965 | Lamoreaux ................... 528/15 |
| 3,775,452 | A |  | 11/1973 | Karstedt ....................... 556/10 |
| 4,310,469 | A |  | 1/1982 | Crivello ........................ 556/64 |
| 4,617,238 | A |  | 10/1986 | Crivello ....................... 428/452 |
| 5,256,487 | A | * | 10/1993 | Myers ......................... 428/447 |
| 6,413,646 | B1 | * | 7/2002 | Pohl et al. .................... 428/447 |
| 6,590,010 | B1 | * | 7/2003 | Kato et al. ................... 522/148 |
| 6,899,991 | B1 | * | 5/2005 | Kato et al. ................ 430/270.1 |
| 2002/0055550 | A1 |  | 5/2002 | Kato et al. |
| 2003/0113662 | A1 |  | 6/2003 | Kato et al. |

FOREIGN PATENT DOCUMENTS

| JP | 55-105627 A | 8/1980 |
| JP | 59-500522 A | 3/1984 |
| JP | 4-136860 A | 5/1992 |
| JP | 11-335464 A | 12/1999 |

* cited by examiner

*Primary Examiner*—John S. Chu
(74) *Attorney, Agent, or Firm*—Birch, Stewart, Kolasch and Birch, LLP

(57) ABSTRACT

A novel organosiloxane polymer is obtained by addition reaction of an organohydrogenpolysiloxane, an alkenyl-containing organopolysiloxane and an unsaturated compound of formula (3) or (4). Using the organosiloxane polymer, a photo-curable resin composition is prepared which can be exposed to radiation having a wide range of wavelength and developed to form a pattern.

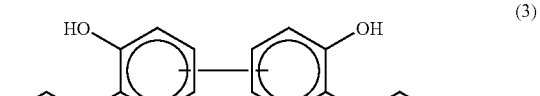

(3)

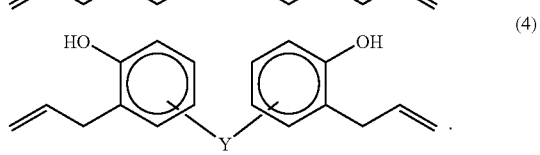

(4)

7 Claims, No Drawings

ORGANOSILOXANE POLYMER, PHOTO-CURABLE RESIN COMPOSITION, PATTERNING PROCESS, AND SUBSTRATE PROTECTIVE FILM

This Nonprovisional application claims priority under 35 U.S.C. § 119(a) on Patent Application Nos. 2003-003969 and 2003-014274 filed in JAPAN on Jan. 10, 2003 and Jan. 23, 2003, the entire contents of which are hereby incorporated by reference.

BACKGROUND OF THE INVENTION

1. Field of the Invention

This invention relates to an organosiloxane polymer suitable for use as a base polymer in photo-curable resin compositions, a photo-curable resin composition comprising the same, a patterning process, and a substrate protective film made from the composition.

2. Background Art

Organosiloxane base photo-curable resin compositions are advantageously used as protective coatings, insulating coatings and release coatings and even as photoresists for fine-circuitry fabrication.

Among prior art organosiloxane base photo-curable resin compositions, those using photoacid generators are well known. For example, JP-A 55-105627 describes a resin composition comprising an epoxy radical-containing organosiloxane and a diaryl iodonium salt as the photoacid generator. JP-A 59-500522 describes a resin composition comprising a vinyl ether radical-containing organosiloxane and an onium salt as the photoacid generator. These resin compositions, however, suffer from the problems that only photoacid generators of selected type can be used because of the incompatibility between the resin and the photoacid generator, and only light sources in a limited range of wavelength can be utilized. If these resin compositions are used as resist materials for micro-fabrication, the resins are insufficiently photo-curable to achieve precise micro-patterning. Also, an organosiloxane base photo-curable resin composition using a linear hydroxyorganosiloxane is known in the art as disclosed in JP-A 11-335464, but its strength is not so high. As the resist material for fine-circuitry fabrication, resin compositions comprising a cresol novolac resin or polyhydroxystyrene resin, an alkoxymethylated amino resin and a photoacid generator are known as disclosed in JP-A 4-136860. These materials have the shortcoming that cured films after development are less elastic or less compliant so that when other resins are laminated thereon, delamination or cracking readily occurs due to differential stresses. Because of their essentially low transparency, thick films tend to lose sensitivity. Besides, when such compositions are used as a protective insulating material for substrates, there arises an essential problem: poor adhesion to substrates.

The recent outstanding progress of the information technology encourages the size and weight reduction of electronic parts used in low-profile information terminals as typified by mobile phones, digital cameras and portable audio equipment. To attain such purposes, the concept of wafer-level chip size package (W-CSP) was proposed for the manufacture of semiconductor devices and has been used in practice.

In a general process of the W-CSP, a thin-film seed layer of titanium/copper is disposed on a wafer which has completed a conventional LSI process, a pattern is formed using a thick film of photosensitive material, and copper plating is performed to form redistribution wiring. At this point, the photosensitive material is once removed. On the copper plated redistribution wiring and copper thin-film seed layer having a step therebetween, a pattern is formed using a thick film of photosensitive material again. Copper plating is performed again to form via posts.

As is well known in the art, the metal of copper tends to readily bond with air-borne oxygen to form an oxide film and also tends to allow copper atoms to gradually diffuse into an organic material disposed in close contact therewith, and is chemically highly active. Thus, when a photosensitive material is imagewise processed on the copper surface, difficulties often arise which are not encountered in the processing on films of other metals or oxides or nitrides thereof. In the above-described proposal, patterning on the copper surface is unstable, imposing difficulty in finding a compromise between resolution and close adhesion. This raises the problem that the coating of the composition separates away from the substrate during development or is left in unexposed areas even after development. It would be desirable to solve these problems.

SUMMARY OF THE INVENTION

An object of the invention is to provide a photo-curable resin composition which can be exposed to light having a wide range of wavelength and form a highly elastic, transparent, minute pattern; a substrate protective film made thereof which has a high dielectric strength and improved adhesion to substrates; and a novel organosiloxane polymer useful in the composition. A further object of the invention is to provide a photo-curable resin composition which can form a pattern having improved substrate adhesion, especially high resolution and adhesion on a copper surface, and dry etching resistance; a patterning process using the same; and a substrate protective film.

It has been found that an organosiloxane polymer obtained by addition reaction of an organohydrogenpolysiloxane of the average compositional formula (1), an alkenyl-containing organopolysiloxane of the average compositional formula (2) and an unsaturated compound of the general formula (3) or (4) can be exposed to light having a wide range of wavelength and processed to form a highly elastic, transparent, minute pattern according to a patterning process to be described later; and that a cured coating obtained from a photo-curable resin composition comprising the organosiloxane polymer by the patterning process has improved substrate adhesion, heat resistance and electrical insulation as well as drastically improved strength as compared with linear organosiloxane polymers. The addition of benzotriazole or a derivative thereof to the photo-curable resin composition restrains excessive reaction on a copper surface; and a cured coating of this resin composition has improved adhesion to the underlying substrate, especially a copper surface. When a silicon compound of the general formula (5) or a hydrolytic condensate thereof is added to the photo-curable resin composition, a cured coating of the composition has further improved adhesion to various surfaces of substrates including a copper surface.

In a first aspect, the present invention provides an organosiloxane polymer obtained by addition reaction of an organohydrogenpolysiloxane of the average compositional formula (1), an alkenyl-containing organopolysiloxane of the average compositional formula (2) and an unsaturated compound of the general formula (3) or (4).

   (1)

In formula (1), a and b are positive numbers satisfying $0 \leq a < 3$, $0 < b \leq 3$, and $0 < a+b \leq 3$, and $R^1$ is independently an organic radical selected from aliphatic unsaturation-free, substituted or unsubstituted, monovalent hydrocarbon radicals having 1 to 30 carbon atoms.

  (2)

In formula (2), c and d are positive numbers satisfying $0 \leq c < 3$, $0 < d \leq 3$ and $0 < c+d \leq 3$, $R^3$ is independently an organic radical selected from aliphatic unsaturation-free, substituted or unsubstituted, monovalent hydrocarbon radicals having 1 to 30 carbon atoms, and $R^4$ is an alkenyl radical.

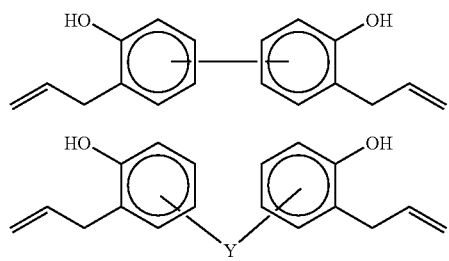

In formula (4),

is

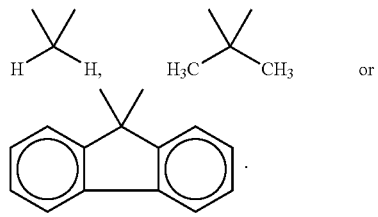

In a second aspect, the present invention provides a photo-curable resin composition comprising (A) the aforementioned organosiloxane polymer, (B) at least one compound selected from the group consisting of an amino condensate modified with formalin or formalin-alcohol, a phenol compound having on the average at least two methylol or alkoxymethylol radicals in a molecule, and an epoxy compound having on the average at least two epoxy radicals in a molecule, and (C) a photoacid generator.

The photo-curable resin composition may further comprises (D) benzotriazole or a derivative thereof and/or (E) a silicon compound of the general formula (5):

  (5)

wherein $R^{11}$ is a substituted or unsubstituted, monovalent hydrocarbon radical having 1 to 9 carbon atoms, $R^{12}$ is an alkyl radical having 1 to 4 carbon atoms, $R^{11}$ and $R^{12}$ may be the same or different, and m is an integer of 0 to 2, or a partial hydrolytic condensate thereof.

In a third aspect, the present invention provides a patterning process comprising the steps of (i) applying the photo-curable resin composition defined above onto a substrate to form a coating, (ii) exposing the coating through a photomask to light having a wavelength of 150 to 450 nm, and (iii) developing the exposed coating with a liquid developer.

Also contemplated herein is a substrate protective film obtained by post-curing the coating which is patterned by the above process.

DESCRIPTION OF THE PREFERRED EMBODIMENTS

Polymer

The organosiloxane polymer of the invention is the addition reaction product of an organohydrogenpolysiloxane, an alkenyl-containing organopolysiloxane and an unsaturated compound.

The organohydrogenpolysiloxane used herein has the average compositional formula (1).

  (1)

In formula (1), $R^1$ is independently selected from aliphatic unsaturation-free, substituted or unsubstituted, monovalent hydrocarbon radicals having 1 to 30 carbon atoms, preferably 1 to 10 carbon atoms, for example, alkyl, aryl, aralkyl and halogenated hydrocarbon radicals. The letters a and b are positive numbers satisfying $0 \leq a < 3$, $0 \leq 3$, and $0 < a+b \leq 3$, preferably $0.2 \leq a \leq 2.5$, $0.005 \leq b \leq 2$, and $0.3 \leq a+b \leq 3$.

Examples of $R^1$ include alkyl radicals such as methyl, ethyl, propyl, isopropyl, butyl, isobutyl, tert-butyl, pentyl, hexyl, heptyl, octyl, nonyl and decyl, cycloalkyl radicals such as cyclopentyl and cyclohexyl, aryl radicals such as phenyl, tolyl and xylyl, aralkyl radicals such as benzyl, phenylethyl and phenylpropyl, and halogenated hydrocarbon radicals such as trifluoropropyl and heptadecafluorodecyl. The organohydrogenpolysiloxane used herein may be either linear, branched or cyclic although linear one is preferred because of high addition reactivity. The positions at which SiH radicals are attached are not particularly limited and SiH radicals may be attached to either side chains or ends of the molecular chain.

Preferably, the number of silicon atoms per molecule in the organohydrogenpolysiloxane of formula (1) is from 1 to 500, more preferably from 2 to 100, most preferably from 2 to 50. Also preferably, the number of hydrogen atoms attached to silicon atoms (i.e., SiH radicals) is on the average 1.5 to 50, more preferably 2 to 20 per molecule.

The molecular structure of the organohydrogenpolysiloxane of formula (1) is not critical and may be linear, branched or three-dimensional network (resinous). The organohydrogenpolysiloxane may be used alone or in admixture of any.

Specific examples of the organohydrogenpolysiloxane include a methylhydrogensiloxane cyclic polymer, a methylhydrogen-dimethylsiloxane cyclic polymer, a both end trimethylsiloxy radical-capped methylhydrogen-dimethylsiloxane copolymer, a both end dimethylhydrogensiloxy radical-capped dimethylpolysiloxane, a both end dimethylhydrogensiloxy radical-capped methylhydrogen-dimethylsiloxane copolymer, a both end dimethylhydrogensiloxy radical-capped methylhydrogen-dimethylsiloxane-diphenylsiloxane copolymer, a both end dimethylhydrogensiloxy radical-capped methylhydrogen-diphenylsiloxane copolymer,
a both end trimethylsiloxy radical-capped methylhydrogen-diphenylsiloxane copolymer,
a both end trimethylsiloxy radical-capped methylhydrogen-diphenylsiloxane-dimethylsiloxane copolymer,
a copolymer composed of $(CH_3)_3SiO_{1/2}$ units, $HSiO_{3/2}$ units and $SiO_{4/2}$ units,
a copolymer composed of $(CH_3)_3SiO_{1/2}$ units, $HSiO_{3/2}$ units, $(CH_3)_2SiO_{2/2}$ units and $SiO_{4/2}$ units,
a copolymer composed of $(CH_3)_2HSiO_{1/2}$ units and $SiO_{4/2}$ units,
a copolymer composed of $(CH_3)_2HSiO_{1/2}$ units, $HSiO_{3/2}$ units and $SiO_{4/2}$ units,
a copolymer composed of $(CH_3)_2HSiO_{1/2}$ units and $HSiO_{3/2}$ units,
a copolymer composed of $(CH_3)_2HSiO_{1/2}$ units and $(CH_3)SiO_{3/2}$ units,
a copolymer composed of $(CH_3)_3SiO_{1/2}$ units, $(CH_3)_2HSiO_{1/2}$ units and $SiO_{4/2}$ units,
a copolymer composed of $(CH_3)_2HSiO_{1/2}$ units, $SiO_{4/2}$ units and $(C_6H_5)SiO_{3/2}$ units, and
a copolymer composed of $(CH_3)HSiO_{2/2}$ units, $(CH_3)SiO_{3/2}$ units, and/or $HSiO_{3/2}$ units.

The organohydrogenpolysiloxane may have any desired degree of polymerization, although it is preferred for compatibility with other components and ease of synthesis that the number of silicon atoms per molecule or degree of polymerization be in the range of 1 to 500, more preferably 2 to 100, most preferably 2 to 50.

The alkenyl radical-containing organopolysiloxane used herein is of the average compositional formula (2).

$$R^3_c R^4_d SiO_{(4-c-d)/2} \quad (2)$$

In formula (2), c and d are positive numbers satisfying $0 \leq c < 3$, $0 < d \leq 3$ and $0 < c+d \leq 3$, preferably $0.2 \leq c \leq 2.5$, $0.005 \leq d \leq 2$ and $0.3 \leq c+d \leq 3$. $R^3$ which may be the same or different is an organic radical selected from aliphatic unsaturation-free, substituted or unsubstituted, monovalent hydrocarbon radicals having 1 to 30 carbon atoms, preferably 1 to 10 carbon atoms, for example, alkyl, aryl, aralkyl and halogenated hydrocarbon radicals. Examples include alkyl radicals such as methyl, ethyl, propyl, butyl, isobutyl, tert-butyl, pentyl, hexyl, heptyl, octyl, nonyl and decyl, cycloalkyl radicals such as cyclopentyl and cyclohexyl, aryl radicals such as phenyl and tolyl, aralkyl radicals such as benzyl and phenethyl, and halogenated hydrocarbon radicals such as trifluoropropyl and heptadecafluorodecyl.

$R^4$ is an alkenyl radical, preferably having 2 to 30 carbon atoms, more preferably 2 to 8 carbon atoms, most preferably 2 to 4 carbon atoms. Examples include vinyl, allyl, propenyl, isopropenyl, butenyl, isobutenyl, hexenyl and pentenyl.

The organopolysiloxane preferably contains on the average 1.5 to 50, more preferably 2 to 20 alkenyl radicals per molecule. The position at which alkenyl radical is attached is not critical and may be either on a side chain or at an end or both.

The molecular structure of the organopolysiloxane of lo formula (2) is not critical and may be linear, cyclic, branched or three-dimensional network (resinous). The organopolysiloxane may be used alone or in admixture of any.

Specific examples of the organopolysiloxane include
a methylvinylsiloxane cyclic polymer,
a methylvinyl-dimethylsiloxane cyclic polymer,
a both end trimethylsiloxy radical-capped methylvinylpolysiloxane,
a both end trimethylsiloxy radical-capped methylvinyl-dimethylsiloxane copolymer,
a both end dimethylvinylsiloxy radical-capped dimethylpolysiloxane,
a both end dimethylvinylsiloxy radical-capped methylvinyl-dimethylsiloxane copolymer,
a both end dimethylvinylsiloxy radical-capped methylvinyl-dimethylsiloxane-diphenylsiloxane copolymer,
a both end dimethylvinylsiloxy radical-capped dimethylsiloxane-diphenylsiloxane copolymer,
a both end dimethylvinylsiloxy radical-capped methylvinyl-diphenylsiloxane copolymer,
a both end trimethylsiloxy radical-capped methylvinyl-diphenylsiloxane copolymer,
a both end trimethylsiloxy radical-capped methylvinyl-diphenylsiloxane-dimethylsiloxane copolymer,
a copolymer composed of $(CH_3)_3SiO_{1/2}$ units, $(CH_2=CH)SiO_{3/2}$ units and $SiO_{4/2}$ units,
a copolymer composed of $(CH_3)_3SiO_{1/2}$ units, $(CH_2=CH)SiO_{3/2}$ units, $(CH_3)_2SiO_{2/2}$ units and $SiO_{4/2}$ units,
a copolymer composed of $(CH_3)_2(CH_2=CH)SiO_{1/2}$ units and $SiO_{4/2}$ units,
a copolymer composed of $(CH_3)_2(CH_2=CH)SiO_{1/2}$ units, $(CH_2=CH)SiO_{3/2}$ units and $SiO_{4/2}$ units,
a copolymer composed of $(CH_3)_2(CH_2=CH)SiO_{1/2}$ units and $(CH_2=CH)SiO_{3/2}$ units,
a copolymer composed of $(CH_3)_2(CH_2=CH)SiO_{1/2}$ units and $(CH_3)SiO_{3/2}$ units,
a copolymer composed of $(CH_3)_3SiO_{1/2}$ units, $(CH_3)_2(CH_2=CH)SiO_{1/2}$ units and $SiO_{4/2}$ units,
a copolymer composed of $(CH_3)_2(CH_2=CH)SiO_{1/2}$ units, $SiO_{4/2}$ units and $(C_6H_5)SiO_{3/2}$ units, and
a copolymer composed of $(CH_3)(CH_2=CH)SiO_{2/2}$ units, $(CH_3)SiO_{3/2}$ units and/or $(CH_2=CH)SiO_{3/2}$ units.

The alkenyl radical-containing organopolysiloxane may have any desired degree of polymerization, although it is preferred for compatibility with other components and ease of synthesis that the number of silicon atoms per molecule or degree of polymerization be in the range of 1 to 500, more preferably 2 to 100, most preferably 2 to 50.

The unsaturated compound is of the general formula (3) or (4).

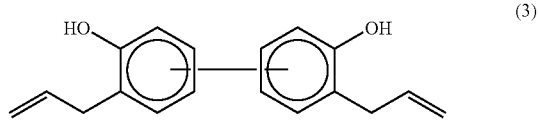

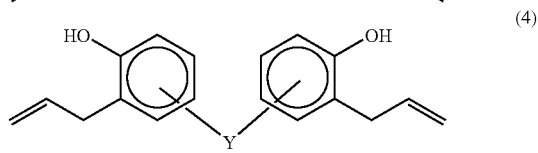

In formula (4),

is

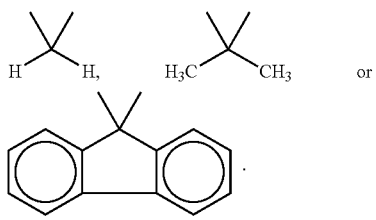

The organosiloxane polymer of the invention can be easily polymerized by effecting addition reaction of an organohydrogenpolysiloxane of the average compositional formula (1), an alkenyl-containing organopolysiloxane of the average compositional formula (2) and an unsaturated compound of the general formula (3) or (4) in any desired proportion and in-the presence of a catalyst.

Catalysts suitable for use in the addition reaction include platinum group metals such as platinum (inclusive of platinum black), rhodium and palladium; platinum chloride, chloroplatinic acid and salts thereof, such as $H_2PtCl_4 \cdot nH_2O$, $H_2PtCl_6 \cdot nH_2O$, $NaHPtCl_6 \cdot nH_2O$, $KHPtCl_6 \cdot nH_2O$, $Na_2PtCl_6 \cdot nH_2O$, $K_2PtCl_4 \cdot nH_2O$, $PtCl_4 \cdot nH_2O$, $PtCl_2$, and $Na_2HPtCl_4 \cdot nH_2O$ wherein n is an integer of 0 to 6, especially 0 or 6; alcohol-modified chloroplatinic acid (see U.S. Pat. No. 3,220,972); chloroplatinic acid-olefin complexes (see U.S. Pat. No. 3,159,601, U.S. Pat. No. 3,159,662 and U.S. Pat. No. 3,775,452); platinum group metals such as platinum black and palladium on supports such as alumina, silica and carbon; rhodium-olefin complexes; chlorotris(triphenylphosphine)rhodium (known as Wilkinson catalyst); and complexes of platinum chloride, chloroplatinic acid and salts thereof with vinyl radical-containing siloxanes (typically, vinyl radical-containing cyclic siloxanes).

In the addition reaction, an organic solvent may be used if necessary. Suitable organic solvents include aliphatic alcohols such as methanol, ethanol, 2-propanol and butanol, aromatic hydrocarbons such as toluene and xylene, aliphatic or cycloaliphatic hydrocarbons such as n-pentane, n-hexane and cyclohexane, and halogenated hydrocarbons such as dichloromethane, chloroform and-carbon tetrachloride. Preferred are toluene and xylene.

Of polymerization conditions, the polymerization temperature is preferably in the range of 40 to 150° C., more preferably 80 to 120° C. At too low a polymerization temperature, a long time may be needed until the completion of polymerization. Too high a polymerization temperature can deactivate the catalyst.

The polymerization time varies with the type and amount of a polymer to be produced. Polymerization is preferably completed within 0.5 to 10 hours, more preferably 0.5 to 5 hours in order to prevent entry of moisture into the polymerization system. It is preferred that the organohydrogenpolysiloxane of formula (1) be added dropwise because organohydrogensiloxanes are susceptible to side reaction, i.e., disproportionation reaction and the hydrosilylation polymerization reaction is generally exothermic.

The organosiloxane polymer of the invention preferably has a weight average molecular weight (Mw) of 3,000 to 300,000, more preferably 5,000 to 150,000. With a Mw of less than 3,000, the polymer may become less photo-curable. A polymer with a Mw in excess of 300,000 may become less compatible with a formalin or formalin-alcohol-modified amino condensate or the like and a photoacid generator, to be described later.

The molecular weight can be readily controlled by adjusting the ratio of the total number of unsaturated radicals in the alkenyl-containing organopolysiloxane of formula (2) and the unsaturated compound of formula (3) or (4) to the total number of hydrosilyl (SiH) radicals in the organohydrogenpolysiloxane of formula (1), that is, [(total unsaturated radicals)/(total hydrosilyl radicals)] ratio. Thus components of formula (1), (2) and (3) or (4) may be blended in such amounts as to give a [(total unsaturated radicals)/(total hydrosilyl radicals)] ratio to provide a desired weight average molecular weight in the polymerization reaction composition. Specifically stated, the [(total unsaturated radicals)/(total hydrosilyl radicals)] ratio to provide a weight average molecular weight of 3,000 to 300,000 to the inventive organosiloxane polymer is preferably between 0.5 and 2, more preferably between 0.8 and 1.2.

Resin Composition

The photo-curable resin composition of the invention comprises:

(A) the organosiloxane polymer described above, (B) at least one member selected from among amino condensates modified with formalin or formalin-alcohol, phenol compounds having on the average at least two methylol or alkoxymethylol radicals in a molecule, and epoxy compounds having on the average at least two epoxy radicals in a molecule, and (C) a photoacid generator.

Optionally and preferably, the composition further includes:

(D) benzotriazole or a derivative thereof, and/or (E) a silicon compound of the general formula (5):

$$(R^{11})_mSi(OR^{12})_{4-m} \quad (5)$$

wherein $R^{11}$ is a substituted or unsubstituted, monovalent hydrocarbon radical having 1 to 9 carbon atoms, $R^{12}$ is an alkyl radical having 1 to 4 carbon atoms, $R^{11}$ and $R^{12}$ may be the same or different, and m is an integer of 0 to 2, or a partial hydrolytic condensate thereof.

Component (B) is a crosslinking agent which undergoes curing reaction with component (A) for thereby augmenting the strength of a cured product. The compound used as component (B) should preferably have a weight average molecular weight Mw of about 200 to 5,000, and more preferably about 300 to 3,000. A compound with Mw of less than 200 may fail to provide a sufficient photo-cure ability whereas a compound with Mw in excess of 5,000 may be less compatible with the organosiloxane polymer (A).

The amino condensates modified with formalin or formalin-alcohol as component (B) include melamine condensates modified with formalin or formalin-alcohol, and urea condensates modified with formalin or formalin-alcohol.

The modified melamine condensates are prepared, for example, by modifying a melamine monomer with formalin into a methylol form in a well-known manner, and optionally, further modifying it with an alcohol into an alkoxy form, thereby yielding a modified melamine of the formula (6) shown below. The alcohols used herein are lower alcohols, for example, alcohols having 1 to 4 carbon atoms.

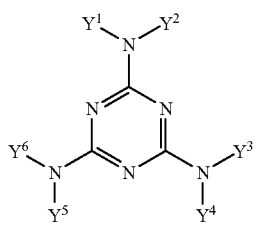

(6)

Herein, $Y^1$ to $Y^6$, which may be the same or different, each are a methylol radical, an alkoxymethyl radical containing an alkoxy portion of 1 to 4 carbon atoms, or hydrogen, and at least one of $Y^1$ to $Y^6$ is a methylol or alkoxymethyl radical. Illustratively, $Y^1$ to $Y^6$ each are a methylol radical, an alkoxymethyl radical such as methoxymethyl or ethoxymethyl, or hydrogen.

Illustrative, non-limiting, examples of the modified melamine of formula (6) include trimethoxymethylmonomethylolmelamine, dimethoxymethylmonomethylolmelamine, trimethylolmelamine, hexamethylolmelamine, and hexamethoxymethylolmelamine.

Next, the modified melamine of formula (6) or an oligomer thereof (e.g., dimer or trimer) is customarily subjected to addition condensation polymerization with formaldehyde until a desired molecular weight is reached, thereby obtaining the formalin or formalin-alcohol-modified melamine condensate as component (B). One or more modified melamine condensates may be used as component (B).

Also, the urea condensates modified with formalin or formalin-alcohol are prepared, for example, by modifying a urea condensate having a desired molecular weight with formalin into a methylol form in a well-known manner, and optionally, further modifying it with an alcohol into an alkoxy form.

Illustrative examples of the modified urea condensate include methoxymethylated urea condensates, ethoxymethylated urea condensates, and propoxymethylated urea condensates. One or more modified urea condensates may be used as component (B).

Another component (B) is a phenol compound having on the average at least two methylol or alkoxymethylol radicals in a molecule, examples of which include (2-hydroxy-5-methyl)-1,3-benzenedimethanol and 2,2',6,6'-tetramethoxymethylbisphenol A.

A further component (B) is an epoxy compound having on the average at least two epoxy radicals in a molecule. Examples include bisphenol type epoxy resins such as bisphenol A type epoxy resins and bisphenol F type epoxy resins, novolac type epoxy resins such as phenol novolac type epoxy resins and cresol novolac type epoxy resins, triphenolalkane type epoxy resins and polymers thereof, biphenyl type epoxy resins, dicyclopentadiene-modified phenol novolac type epoxy resins, phenolaralkyl type epoxy resins, biphenylaralkyl type epoxy resins, naphthalene ring-containing epoxy resins, glycidyl ester type epoxy resins, alicyclic epoxy resins, and heterocyclic epoxy resins.

As component (B), the amino condensates, phenol compounds and epoxy compounds may be used alone or in admixture of any.

An appropriate amount of the amino condensate, phenol compound or epoxy compound used as component (B) is about 1 to 50 parts, and especially about 1 to 30 parts by weight per 100 parts by weight of the organosiloxane polymer (A). Less than 1 part of component (B) may fail to provide a satisfactory cure ability upon light exposure whereas more than 50 parts of component (B) may lead to a lower proportion of siloxane bonds in the photo-curable resin composition, which cures into a product with least of the desired effects.

The photoacid generator (C) is typically a compound which upon light exposure, generates an acid serving as a curing catalyst. Since the resin composition of the invention is highly compatible with the photoacid generator, the photoacid generator may be selected from a wide variety of such compounds. Typical photoacid generators include onium salts, diazomethane derivatives, glyoxime derivatives, β-ketosulfone derivatives, disulfone derivatives, nitrobenzyl sulfonate derivatives, sulfonic acid ester derivatives, imidoyl sulfonate derivatives, oxime sulfonate derivatives, and triazine derivatives.

Exemplary onium salts are compounds of the following general formula (7).

$$(R^5)_w M^+ K^-$$ (7)

In the formula, $R^5$ is a straight, branched or cyclic alkyl of 1 to 12 carbon atoms, an aryl of 6 to 12 carbon atoms, or an aralkyl of 7 to 12 carbon atoms, which may have a substituent; $M^+$ is iodonium or sulfonium; $K^-$ is a non-nucleophilic counter-ion; and the letter w is 2 or 3.

Illustrative examples of alkyl radicals represented by $R^5$ include methyl, ethyl, propyl, butyl, cyclohexyl, 2-oxocyclohexyl, norbornyl, and adamantyl. Exemplary aryl radicals include phenyl; alkoxyphenyl radicals such as p-methoxyphenyl, m-methoxyphenyl, o-methoxyphenyl, ethoxyphenyl, p-tert-butoxyphenyl, and m-tert-butoxyphenyl; and alkylphenyl radicals such as 2-methylphenyl, 3-methylphenyl, 4-methylphenyl, ethylphenyl, 4-tert-butylphenyl, 4-butylphenyl, and dimethylphenyl. Exemplary aralkyl radicals include benzyl and phenethyl.

Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

Exemplary diazomethane derivatives are compounds of the following general formula (8).

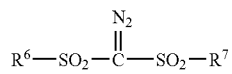

(8)

In the formula, $R^6$ and $R^7$, which may be the same or different, are straight, branched or cyclic alkyl or halogenated alkyl radicals of 1 to 12 carbon atoms, aryl or halogenated aryl radicals of 6 to 12 carbon atoms, or aralkyl lo radicals of 7 to 12 carbon atoms.

Illustrative examples of alkyl radicals represented by $R^6$ and $R^7$ include methyl, ethyl, propyl, butyl, amyl, cyclopentyl, cyclohexyl, norbornyl, and adamantyl. Exemplary halogenated alkyl radicals include trifluoromethyl, 1,1,1-trifluoroethyl, 1,1,1-trichloroethyl, and nonafluorobutyl. Exemplary aryl radicals include phenyl; alkoxyphenyl radicals such as p-methoxyphenyl, m-methoxyphenyl, o-methoxyphenyl, ethoxyphenyl, p-tert-butoxyphenyl, and m-tert-butoxyphenyl; and alkylphenyl radicals such as 2-methylphenyl, 3-methylphenyl, 4-methylphenyl, ethylphenyl, 4-tert-butylphenyl, 4-butylphenyl, and dimethylphenyl. Exemplary halogenated aryl radicals include fluorophenyl, chlorophenyl, and 1,2,3,4,5-pentafluorophenyl. Exemplary aralkyl radicals include benzyl and phenethyl.

Exemplary glyoxime derivatives are compounds of the following general formula (9).

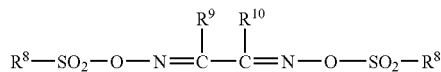

(9)

In the formula, $R^8$ to $R^{10}$, which may be the same or different, are straight, branched or cyclic alkyl or halogenated alkyl radicals of 1 to 12 carbon atoms, aryl or halogenated aryl radicals of 6 to 12 carbon atoms, or aralkyl radicals of 7 to 12 carbon atoms. $R^9$ and $R^{10}$ may together form a cyclic structure with the proviso that if they form a cyclic structure, each is a straight or branched alkylene radical of 1 to 6 carbon atoms.

The alkyl, halogenated alkyl, aryl, halogenated aryl, and aralkyl radicals represented by $R^8$ to $R^{10}$ are exemplified by the same radicals as mentioned above for $R^6$ and $R^7$. Examples of alkylene radicals represented by $R^9$ and $R^{10}$ include methylene, ethylene, propylene, butylene, and hexylene.

Illustrative examples of the photoacid generator (C) include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate and diphenyl(4-thiophenoxyphenyl)sulfonium hexafluoroantimonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

oxime sulfonate derivatives such as α-(benzenesulfoniumoxyimino)-4-methylphenylacetonitrile;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and n-trifluoromethylsulfonyloxynaphthylimide.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-O-(p-toluenesulfonyl)-α-dimethylglyoxime and bis-O-(n-butanesulfonyl)-α-dimethylglyoxime. These photoacid generators may be used singly or in combinations of two or more thereof.

The photoacid generator (C) is preferably added in an amount of about 0.1 to 20 parts by weight, and especially about 0.5 to 5 parts by weight, per 100 parts by weight of the organosiloxane polymer (A). Less than 0.1 part of the photoacid generator may fail to provide a satisfactory photocure ability whereas more than 20 parts of the photoacid generator can exacerbate the photo-curing of a thick film due to the light absorption of the photoacid generator itself.

Component (D) is selected from among benzotriazole and derivatives thereof, which are known as a rust inhibitor for metals such as copper and silver, and a UV absorber for imparting weather resistance to plastics and coatings. Examples include benzotriazole, 1-hydroxy-1H-benzotriazole, 1-(methoxymethyl)-1H-benzotriazole, 1H-benzotriazole-1-methanol, 1-(chloromethyl)-1H-benzotriazole, 2-(5-methyl-2-hydroxyphenyl)benzotriazole, 2-[2-hydroxy-3,5-bis($\alpha$,$\alpha$-dimethylbenzyl)phenyl]-2H-benzotriazole, 2-(3,5-di-t-butyl-2-hydroxyphenyl)benzotriazole, 2-(3-t-butyl-5-methyl-2-hydroxyphenyl)-5-chlorobenzotriazole, 2-(3,5-di-t-butyl-2-hydroxyphenyl)-5-chlorobenzotriazole, 2-(3,5-di-t-amyl-2-hydroxyphenyl)benzotriazole, 2-(2'-hydroxy-5'-t-octylphenyl)benzotriazole, and methyl-3-[3-t-butyl-5-(2H-benzotriazol-2-yl)-4-hydroxyphenyl]propionate polyethylene.

An appropriate amount of benzotriazole or derivative (D) is 0 to 10 parts by weight, preferably 0.01 to 10 parts by weight, more preferably 0.05 to 5 parts by weight per 100 parts by weight of the organosiloxane polymer (A). With less than 0.01 pbw of component (D) in the photo-curable resin composition, reaction can occur between a coating of the composition and a copper substrate during pre-baking, impeding pattern formation. More than 10 pbw of component (D) may invite a substantial drop of sensitivity and detract from ease of working.

Component (E) is a silicon compound of the following general formula (5) or a partial hydrolytic condensate thereof.

$$(R^{11})_m Si(OR^{12})_{4-m} \quad (5)$$

Herein $R^{11}$ is a substituted or unsubstituted monovalent hydrocarbon radical of 1 to 9 carbon atoms, $R^{12}$ is an alkyl radical of 1 to 4 carbon atoms, $R^{11}$ and $R^{12}$ may be the same or different, m is an integer of 0 to 2.

Examples of suitable monovalent hydrocarbon radical of 1 to 9 carbon atoms represented by $R^{11}$ include alkyl, alkenyl, aryl, aralkyl radicals and substituted ones of these radicals in which some hydrogen atoms are substituted with glycidyl, glycyloxy, acrylic, methacrylic, acryloxy, methacryloxy, amino, alkylamino, aminoalkylamino, mercapto radicals and halogen atoms.

Examples of operable silicon compounds include trimethoxysilane, triethoxysilane, tripropoxysilane, tetramethoxysilane, tetraethoxysilane, tetrapropoxysilane, methyltrimethoxysilane, ethyltrimethoxysilane, propyltrimethoxysilane, methyltriethoxysilane, ethyltriethoxysilane, propyltriethoxysilane, dimethyldimethoxysilane, diethyldiethoxysilane, vinyltrimethoxysilane, vinyltriethoxysilane, γ-(methacryloxypropyl)trimethoxysilane, γ-(methacryloxypropyl)methyldimethoxysilane, γ-glycidoxypropyltrimethoxysilane, γ-glycidoxypropyltriethoxysilane, γ-glycidoxypropylmethyldiethoxysilane, N-β-(aminoethyl)-γ-aminopropyltrimethoxysilane, N-β-(aminoethyl)-γ-aminopropyltriethoxysilane, N-β-(aminoethyl)-γ-aminopropylmethyldimethoxysilane, γ-aminopropyltrimethoxysilane, γ-aminopropyltriethoxysilane, N-phenyl-γ-aminopropyltrimethoxysilane, γ-mercaptopropyltrimethoxysilane, γ-chloropropyltrimethoxysilane, and partial hydrolytic condensates thereof. Of these, preferred are tetramethoxysilane, tetraethoxysilane, methyltrimethoxysilane, methyltriethoxysilane, ethyltrimethoxysilane, ethyltriethoxysilane, N-β-(aminoethyl)-γ-aminopropylmethyldimethoxysilane, N-β-(aminoethyl)-γ-aminopropyltrimethoxysilane, γ-glycidoxypropyltrimethoxysilane, γ-aminopropyltriethoxysilane, γ-(methacryloxypropyl)trimethoxysilane, and partial hydrolytic condensates thereof.

The silicon compounds and partial hydrolytic condensates thereof may be used alone or in admixture of any. The partial hydrolytic condensate may be a co-hydrolyzate of two or more alkoxysilanes.

An appropriate amount of the silicon compound or partial hydrolytic condensate (E) blended is 0 to 20 parts by weight, more preferably 0.01 to 20 parts by weight, most preferably 0.05 to 5 parts by weight per 100 parts by weight of the organosiloxane polymer (A). Less than 0.01 pbw of component (E) may fail to fully improve the adhesion between a coating of the composition and a substrate whereas a composition containing more than 20 pbw of component (E) may form a less curable coating.

If necessary, an organic solvent may be blended in the photo-curable resin composition of the invention. Those organic solvents in which components (A) to (C) are dissolvable are preferred. Illustrative, non-limiting, examples of the organic solvent include ketones such as cyclohexanone, cyclopentanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. The solvents may be used alone or in admixture of any.

Of these organic solvents, preferred are diethylene glycol dimethyl ether and 1-ethoxy-2-propanol in which the photoacid generator is most soluble, propylene glycol monomethyl ether acetate and ethyl lactate which are safe solvents, and mixtures thereof.

An appropriate amount of the organic solvent used is about 50 to 2,000 parts, and especially about 100 to 1,000 parts by weight per 100 parts by weight of all solids. With less than 50 pbw of the organic solvent, components (A) to (C) may become insufficiently compatible. With more than 2,000 pbw of the organic solvent, little further improvement is made in compatibility and the composition having a too low viscosity may become difficult to apply.

In addition to the aforementioned components, the photo-curable resin composition of the invention may include optional components. For example, there may be added a surfactant which is commonly used for improving the coating characteristics. Preferred are nonionic surfactants, for example, fluorochemical surfactants such as perfluoroalkyl polyoxyethylene ethanols, fluorinated alkyl esters, perfluoroalkylamine oxides, and fluorinated organosiloxane compounds.

These surfactants are commercially available. Illustrative examples include Florade FC-430 and FC-431 from Sumitomo 3M Ltd., Surflon S-141 and S-145 from Asahi Glass Co., Ltd., Unidyne DS-401, DS-4031, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70–093 from Shin-Etsu Chemical Co., Ltd.

Another component which can be added herein is a light absorber for improving the light absorption efficiency of the photoacid generator. Exemplary light absorbers include diaryl sulfoxides, diaryl sulfones, 9,10-dimethylanthracene and 9-fluorenone. Also for increasing the crosslinking density of resist, cresol novolac resins, polyhydroxystyrene resins and phenol compounds may be added. A typical example is trihydroxybenzophenone.

Besides, other optional components which are commonly used in conventional resist materials can be added when the photo-curable resin composition of the invention is used as a resist.

These optional components may be added in conventional amounts so long as this does not compromise the objects of the invention.

The photo-curable resin composition of the invention is prepared in a conventional way. For example, it can be prepared by agitating and mixing the aforementioned components and optionally, organic solvent and additives and passing the mixture through a filter to remove solids, if necessary.

The photo-curable resin composition thus prepared is useful as protective coatings, insulating coatings and strippable coatings and can also be employed as a photoresist material for microfabrication.

When a pattern is formed using the photo-curable resin composition, the patterning process involves the steps of (i) applying the photo-curable resin composition onto a substrate to form a coating, (ii) exposing the coating to radiation having a wavelength of 150 to 450 nm through a photomask, and (iii) developing the exposed coating with a developer.

More particularly, the photo-curable resin composition is first applied onto a substrate. The substrate may be a silicon wafer or quartz substrate, for example. The application may employ well-known techniques complying with lithography. For example, the composition is applied by dipping, spin coating and roll coating. The coverage may be determined as appropriate for a particular purpose although a coating thickness of 0.1 to 100 µm is often preferred.

In order that effective photo-curing reaction take place, the solvent may be previously evaporated off by preheating, if necessary. The preheating is, for example, at about 40 to 140° C. for about 1 to 10 minutes.

Then the coating is exposed to radiation having a wavelength of 150 to 450 nm through a photomask for effecting photo-curing reaction. The photomask used herein may be a member in which a desired pattern has been cut out. The photomask is preferably made of a material capable of shielding the radiation having a wavelength of 150 to 450 nm, for example, chromium.

Examples of the radiation having a wavelength of 150 to 450 nm include radiation of various wavelengths generated by radiation-emitting units, for example, UV radiation (e.g., g-line and i-line), deep UV radiation (248 nm, 198 nm), and electron beams. An appropriate exposure dose is 10 to 500 mJ/cm$^2$, but not limited thereto.

If desired for increasing the development sensitivity, the cured coating may be heat treated. Such post-curing heat treatment is effected, for example, at about 40 to 140° C. for about ½ to 10 minutes.

Following the curing, the coating is developed with a developer. The developer is preferably any of customarily used organic solvents, for example, isopropyl alcohol. Development is effected in a conventional manner, for example, by immersing the cured coating in the developer. The development is followed by washing and drying if necessary. There is obtained a cured coating having the desired pattern.

Although the pattern forming process has been described, it is sometimes unnecessary to form a pattern. When it is simply desired to form a uniform thin film, for example, the same process as above may be followed except that the photomask is not used.

The photo-cured pattern obtained by the above process may be utilized as a mask for processing the substrate. Because of the inclusion of siloxane bonds, the pattern is fully resistant to oxygen plasma and thus best suited as a mask against oxygen plasma etching.

If desired, the pattern may be heated in an oven or hot plate at about 150 to 250° C. for about 10 minutes to about 2 hours for increasing the crosslinking density and removing the residual volatile matter. Then a coating having augmented adhesion to substrates, heat resistance, high strength and good electrical properties can be formed.

Since the cured coating obtained from the photo-curable resin composition in the above-described way has improved substrate adhesion, heat resistance and electrical insulation, it may be advantageously used as a protective film on electric and electronic parts and semiconductor devices.

EXAMPLE

Examples of the invention are given below by way of illustration and not by way of limitation. All parts are by weight. Me is methyl, Ph is phenyl, and GPC is gel permeation chromatography.

Synthesis Example 1

A flask equipped with a stirrer, thermometer, nitrogen purging line and reflux condenser was charged with 48.0 g of 4,4'-(1-methylethylidene)bis[(2-propenyl)phenol], 9.6 g of 1,3,5,7-tetramethyl-1,3,5,7-tetravinylcyclosiloxane, 160 g of toluene and 0.04 g of chloroplatinic acid and heated at 80° C.

Then 22.4 g of 1,3-dihydro-1,1,3,3-tetramethyldisiloxane was added dropwise to the flask. After the dropwise addition, the reaction solution was ripened for 2 hours at 80° C. whereupon the toluene was distilled off. The series of steps yielded 77 g of a liquid product. A GPC analysis revealed a weight average molecular weight of 50,000 based on polystyrene standards.

Synthesis Example 2

A flask equipped with a stirrer, thermometer, nitrogen purging line and reflux condenser was charged with 19.4 g of 3,3'-diallyl-4,4'-biphenyl diol, 5.1 g of a copolymer consisting of $(CH_3)_3SiO_{1/2}$ units, $(CH_3)_2(CH_2=CH)SiO_{1/2}$ units and $SiO_{4/2}$ units in a molar ratio of 40:15:45 and having a weight average molecular weight of 8,000 as determined by GPC using polystyrene standards, 200 g of toluene and 0.05 g of chloroplatinic acid and heated at 80° C. Thereafter, 75.5 g of an organohydrogensiloxane of the average structural formula (10) was added dropwise to the flask.

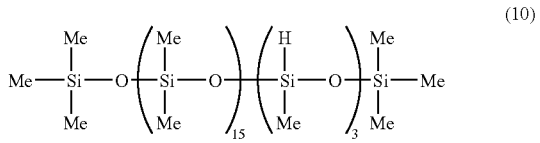

(10)

After the dropwise addition, the reaction solution was ripened for 2 hours at 80° C. whereupon the toluene was distilled off. The series of steps yielded 97 g of a product. A GPC analysis revealed a weight average molecular weight of 80,000 based on polystyrene standards.

Synthesis Example 3

A flask equipped with a stirrer, thermometer, nitrogen purging line and reflux condenser was charged with 24.4 g of 4,4'-(1-methylethylidene)bis[(2-propenyl)phenol], 1.3 g of an organosiloxane of the average structural formula (11), 200.0 g of toluene and 0.05 g of chloroplatinic acid and heated at 80° C.

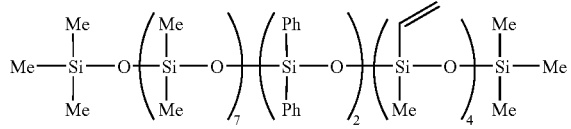

(11)

Thereafter, 74.3 g of an organohydrogensiloxane of the average structural formula (12) was added dropwise to the flask.

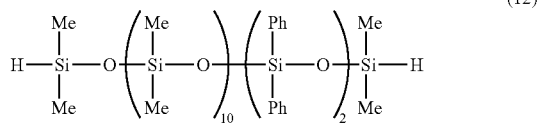

(12)

After the dropwise addition, the reaction solution was ripened for 2 hours at 80° C. whereupon the toluene was distilled off. The series of steps yielded 96 g of a liquid product. A GPC analysis revealed a weight average molecular weight of 100,000 based on polystyrene standards.

Synthesis Example 4

A flask equipped with a stirrer, thermometer, nitrogen purging line and reflux condenser was charged with 76.2 g of 4,4'-(1-methylethylidene)bis[(2-propenyl)phenol], 200 g of toluene and 0.04 g of chloroplatinic acid and heated at 80° C. Thereafter, 23.8 g of 1,3-dihydro-1,1,3,3-tetramethyldisiloxane was added dropwise to the flask. After the dropwise addition, the reaction solution was ripened for 2 hours at 80° C. whereupon the toluene was distilled off. The series of steps yielded 96 g of a liquid product. A GPC analysis revealed a weight average molecular weight of 30,000 based on polystyrene standards.

Synthesis Example 5

A flask equipped with a stirrer, thermometer, nitrogen purging line and reflux condenser was charged with 24.4 g of 4,4'-(1-methylethylidene)bis[(2-propenyl)phenol], 1.3 g of an organosiloxane of the average structural formula (13), 200.0 g of toluene and 0.05 g of chloroplatinic acid and heated at 80° C.

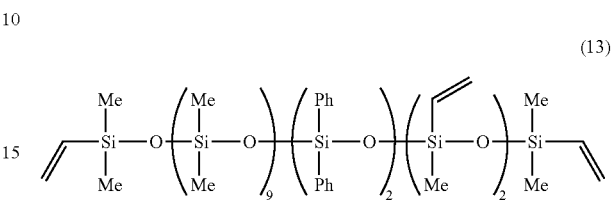

(13)

Thereafter, 74.3 g of an organohydrogensiloxane of the average compositional formula (14) was added dropwise to the flask.

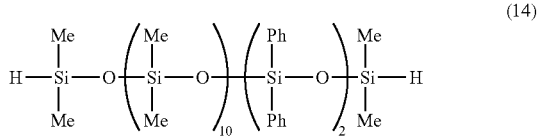

(14)

After the dropwise addition, the reaction solution was ripened for 2 hours at 80° C. whereupon the toluene was distilled off. The series of steps yielded 96 g of a liquid product. A GPC analysis revealed a weight average molecular weight of 100,000 based on polystyrene standards.

Example 1

A photo-curable resin composition within the scope of the invention was prepared by blending the organosiloxane polymer obtained in Synthesis Example 1, a crosslinking agent, a photoacid generator, organic solvent and additive according to the formulation shown in Table 1, agitating and mixing them, and passing the mixture through a filter to remove the solid matter.

By a spin coating technique, the photo-curable resin composition was applied onto a silicon wafer to a thickness of 10 μm.

The coating was heated and dried at 80° C. for one minute for removing the solvent. Through a photomask having a desired stripe pattern, the coated substrate was exposed to radiation having a wavelength shown in Table 1 in an exposure dose shown in Table 1. After the exposure, the substrate was heated at 60° C. for one minute and then cooled.

The coated substrate was immersed in isopropyl alcohol for one minute for development. There was obtained a cured coating having a good retentivity as shown in Table 1.

Example 2

A photo-curable resin composition within the scope of the invention was prepared by blending the organosiloxane polymer obtained in Synthesis Example 2, a crosslinking agent, a photoacid generator, organic solvent and additive according to the formulation shown in Table 1, agitating and mixing them, and passing the mixture through a filter to remove the solid matter.

As in Example 1, the photo-curable resin composition was applied onto a silicon wafer, and the coated substrate was exposed to pattern radiation.

The coated substrate was immersed in isopropyl alcohol for one minute for development. There was formed a stripe pattern of definite line width substantially equivalent to Example 1. The retentivity of cured coating was high as shown in Table 1.

Example 3

A photo-curable resin composition within the scope of the invention was prepared by blending the organosiloxane polymer obtained in Synthesis Example 3, a crosslinking agent, a photoacid generator, organic solvent and additive according to the formulation shown in Table 1, agitating and mixing them, and passing the mixture through a filter to remove the solid matter.

As in Example 1, the photo-curable resin composition was applied onto a silicon wafer, and the coated substrate was exposed to pattern radiation.

The coated substrate was immersed in isopropyl alcohol for one minute for development. There was formed a stripe pattern of definite line width substantially equivalent to Example 1. The retentivity of cured coating was high as shown in Table 1.

As in Example 1, the photo-curable resin composition was applied onto a silicon wafer, and the coated substrate was exposed to pattern radiation.

The coated substrate was immersed in isopropyl alcohol for one minute for development. There was formed a stripe pattern of definite line width substantially equivalent to Example 1. The retentivity of cured coating was as shown in Table 1.

For the compositions of Examples 1 to 3 and Comparative Example 1, the cured coatings were measured for tensile strength. A comparison between the resin of Synthesis Example 1 and the resin of Synthesis Example 4 (which corresponds to the resin of Synthesis Example 1 with the alkenyl-containing siloxane omitted) revealed a substantial improvement in tensile strength. It was also seen that the compositions of Examples 2 and 3 also formed tough coatings after curing.

The patterned cured coatings each were post-cured by holding in a drier at 180° C. for one hour. The adhesion of the coating to the silicon wafer after post-curing was examined by a crosshatch peel test.

As demonstrated in Table 1, all the cured coatings of Examples 1 to 3 were tightly adherent to the substrate, indicating that the cured compositions of the invention are useful as a protective film on electronic parts.

Note that Synthesis Example is abbreviated as SE in Tables.

TABLE 1

| | Composition components | | | | Light source/ exposure | Retentivity after development @10 μm | Resolution @10 μm | Tensile strength | Substrate adhesion after post-cure (peel test) |
|---|---|---|---|---|---|---|---|---|---|
| | Organo-siloxane polymer | Crosslinking agent | Photoacid generator | Additives | | | | | |
| Example 1 | Synthesis Example 1 (100 pbw) | hexamethoxy-methylol-melamine (10 pbw) | I (1 pbw) | polyethylene glycol monomethyl ether acetate (150 pbw) FC-430 (0.001 pbw) | 365 nm 300 mJ/cm² | 97% | 5 μm L/S | 12 MPa | no peel |
| Example 2 | Synthesis Example 2 (100 pbw) | tetramethoxy-methylol bisphenol A (15 pbw) | II (1 pbw) | cyclopentanone (150 pbw) X-70-093 (0.001 pbw) | 436 nm 200 mJ/cm² | 98% | 6 μm L/S | 15 MPa | no peel |
| Example 3 | Synthesis Example 3 (100 pbw) | N,N-diglycidyl-4-glycidiloxy aniline (15 pbw) | III (1 pbw) | ethyl lactate (150 pbw) FC-430 (0.001 pbw) | 248 nm 350 mJ/cm² | 96% | 8 μm L/S | 18 MPa | no peel |
| Comparative Example 1 | Synthesis Example 4 (100 pbw) | hexamethoxy-methylol-melamine (10 pbw) | I (1 pbw) | polyethylene glycol monomethyl ether acetate (150 pbw) FC-430 (0.001 pbw) | 365 nm 300 mJ/cm² | 95% | 6 μm L/S | 1 MPa | no peel |

Comparative Example 1

A photo-curable resin composition was prepared, as in Example 1, by blending the organosiloxane polymer obtained in Synthesis Example 4, a crosslinking agent, a photoacid generator, organic solvent and additive according to the formulation shown in Table 1.

Photoacid generators I to III shown in Table 1 are identified below.

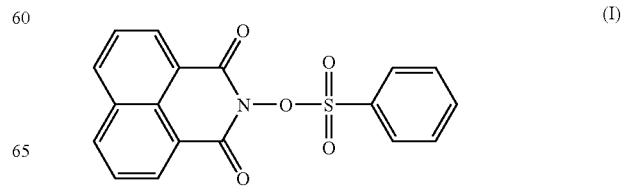

(I)

-continued

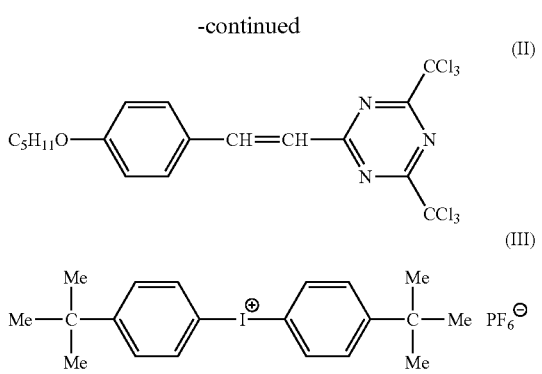

Example 4

A photo-curable resin composition within the scope of the invention was prepared by blending the organosiloxane polymer obtained in Synthesis Example 1, an amino condensate as a crosslinking agent, a photoacid generator, benzotriazole, an organic solvent and a fluorochemical surfactant X-70-093 (Shin-Etsu Chemical Co., Ltd.) according to the formulation shown in Table 2, agitating and mixing them, and passing the mixture through a filter to remove the solid matter.

By a spin coating technique, the photo-curable resin composition was applied onto two silicon wafers having a copper coating plated thereon (to be referred to as copper-plated substrates, hereinafter) to a thickness of 10 μm.

The coatings were heated and dried at 80° C. for one minute for removing the solvent. One of the coated copper-plated substrates was exposed to radiation having a wavelength shown in Table 2 in an exposure dose shown in Table 2. The other coated copper-plated substrate was exposed to radiation having a wavelength shown in Table 2 in an exposure dose shown in Table 2 through a photomask having a desired stripe pattern for forming a pattern. After the exposure, the substrates were heated at 60° C. for one minute and then cooled.

The coated copper-plated substrates were immersed in isopropyl alcohol for one minute for development. There were obtained cured coatings having a good retentivity and resolution as shown in Table 2. The one coated copper-plated substrate subjected to overall exposure was post-cured by holding in a drier at 180° C. for one hour. The adhesion of the coating to the copper-plated substrate was examined by a crosshatch peel test.

As demonstrated in Table 2, the cured coating was tightly adherent to the copper-plated substrate, indicating that the cured compositions of the invention are useful as a protective film on electronic parts.

Example 5

A photo-curable resin composition within the scope of the invention was prepared by blending the organosiloxane polymer obtained in Synthesis Example 5, an amino condensate as a crosslinking agent, a photoacid generator, 1-hydroxy-1H-benzotriazole, an organic solvent and an additive according to the formulation shown in Table 2, agitating and mixing them, and passing the mixture through a filter to remove the solid matter.

As in Example 4, the composition was coated to copper-plated substrates, exposed, and developed. There were obtained cured coatings having a good retentivity and resolution as shown in Table 2. As in Example 4, the coating was post-cured and examined by a crosshatch peel test, finding good adhesion as shown in Table 2.

Example 6

A photo-curable resin composition within the scope of the invention was prepared by blending the organosiloxane polymer obtained in Synthesis Example 5, tetramethoxymethylol bisphenol A as a crosslinking agent, a photoacid generator, benzotriazole, and a silicon compound according to the formulation shown in Table 2, agitating and mixing them, and passing the mixture through a filter to remove the solid matter.

The composition was coated to copper-plated substrates, exposed, and developed as in Example 4 except that the coated substrate was not heated after exposure. There were obtained cured coatings having a good retentivity and resolution as shown in Table 2. As in Example 4, the coating was post-cured and examined by a crosshatch peel test, finding good adhesion as shown in Table 2.

TABLE 2

| | | | | Composition components | | | | | | |
|---|---|---|---|---|---|---|---|---|---|---|
| | Organo-siloxane polymer | Cross-linking agent | Photo-acid generator | Benzo-triazole or derivative | Silicon compound | Additives | Light source/ exposure | Retentivity after development @10 μm | Resolution @10 μm | Substrate adhesion after post-cure (peel test) |
| Example 4 | Synthesis Example 1 (100 pbw) | hexa-methoxy-methylol-melamin (15 pbw) | I (1 pbw) | benzo-triazole (0.1 pbw) | — | ethyl lactate (150 pbw) X-70-093 (0.001 pbw) | 365 nm 190 mJ/cm² | 95% | 6 μm L/S | no peel |
| Example 5 | Synthesis Example 5 (100 pbw) | hexa-methoxy-methylol-melamine (15 pbw) | II (1 pbw) | 1-hydroxy-1H-benzo-triazole (0.3 pbw) | γ-(metha-cryloxy-propyl)-trimethoxy-silane (3 pbw) | PGMEA (150 pbw) X-70-093 (0.001 pbw) | 436 nm 200 mJ/cm² | 93% | 8 μm L/S | no peel |
| Example 6 | Synthesis Example 5 (100 pbw) | tetra-methoxy-methylol | I (1 pbw) | benzo-triazole (0.1 pbw) | γ-glycidoxy-propyl)-trimethoxy- | cyclo-hexanone (150 pbw) | 365 nm | 94% | 10 μm L/S | no peel |

TABLE 2-continued

| Composition components | | | | | | Light source/ exposure | Retentivity after development @10 μm | Resolution @10 μm | Substrate adhesion after post-cure (peel test) |
|---|---|---|---|---|---|---|---|---|---|
| Organo- siloxane polymer | Cross- linking agent | Photo- acid generator | Benzo- triazole or derivative | Silicon compound | Additives | | | | |
| | bisphenol A (20 pbw) | | | silane (3 pbw) | X-70-093 (0.001 pbw) | 200 mJ/cm² | | | |

Note that photoacid generators I and II are the same as in Table 1.

Using the novel organosiloxane polymer of the invention, a photo-curable resin composition is prepared which can be exposed to light having a wide range of wavelength. The composition is developable with an alkaline solution and forms a cured coating which has improved adhesion to substrates, heat resistance and electric insulation and is useful as a protective film for electrical and electronic parts and semiconductor devices. The addition of benzotriazole or derivative thereof allows the photo-curable resin composition to form a pattern on a variety of substrates, even on copper-plated substrates at an improved film retentivity and resolution. The cured coating has improved adhesion to substrate and dry etching resistance.

Japanese Patent Application Nos. 2003-003969 and 2003-014274 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

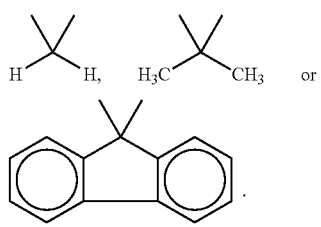

The invention claimed is:

1. An organosiloxane polymer obtained by addition reaction of an organohydrogenpolysiloxane of the average compositional formula (1), an alkenyl-containing organopolysiloxane of the average compositional formula (2) and an unsaturated compound of the general formula (3) or (4), $$R^1{}_aH_bSiO_{(4-a-b)/2} \tag{1}$$

wherein a and b are positive numbers satisfying $0 \leq a < 3$, $0 < b \leq 3$, and $0 < a+b \leq 3$, and $R^1$ is independently an organic radical selected from aliphatic unsaturation-free, substituted or unsubstituted, monovalent hydrocarbon radicals having 1 to 30 carbon atoms, $$R^3{}_cR^4{}_dSiO_{(4-c-d)/2} \tag{2}$$

wherein c and d are positive numbers satisfying $0 \leq c < 3$, $0 < d \leq 3$ and $0 < c+d \leq 3$, $R^3$ is independently an organic radical selected from aliphatic unsaturation-free, substituted or unsubstituted, monovalent hydrocarbon radicals having 1 to 30 carbon atoms, and R4 is an alkenyl radical,

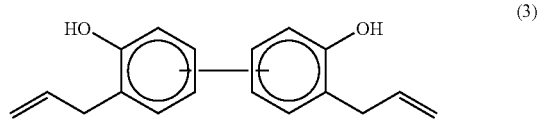

(3)

(4)

wherein

in formula (4) is

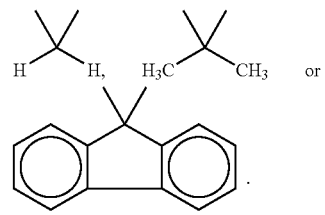

or

.

2. A photo-curable resin composition comprising
(A) the organosiloxane polymer of claim 1,
(B) at least one compound selected from the group consisting of an amino condensate modified with formalin or formalin-alcohol, a phenol compound having on the average at least two methylol or alkoxymethylol radicals in a molecule, and an epoxy compound having on the average at least two epoxy radicals in a molecule, and
(C) a photoacid generator.

3. The photo-curable resin composition of claim 2, further comprising (D) benzotriazole or a derivative thereof.

4. The photo-curable resin composition of claim 2, further comprising (E) a silicon compound of the general formula (5):

$$(R^{11})_mSi(OR^{12})_{4-m} \tag{5}$$

wherein $R^{11}$ is a substituted or unsubstituted, monovalent hydrocarbon radical having 1 to 9 carbon atoms, $R^{12}$ is an alkyl radical having 1 to 4 carbon atoms, $R^{11}$ and $R^{12}$ may be the same or different, and m is an integer of 0 to 2, or a partial hydrolytic condensate thereof.

5. A patterning process comprising the steps of:
(i) applying the photo-curable resin composition of claim 2, onto a substrate to form a coating, (ii) exposing the coating through a photomask to light having a wavelength of 150 to 450 nm, and
(iii) developing the exposed coating with a liquid developer.

6. A substrate protective film obtained by post-curing the coating which is patterned by the process of claim 5.

7. An organosiloxane polymer obtained by addition reaction of an organohydrogenpolysiloxane of the compositional formula (1), an alkenyl-containing organopolysiloxane of the compositional formula (2) and an unsaturated compound of the general formula (3) or (4), $$R^1_a H_b SiO_{(4-a-b)/2} \quad (1)$$

wherein a and b are positive numbers satisfying $0 \leq a < 3$, $0 < b \leq 3$, and $0 < a+b \leq 3$, and $R^1$ is independently an organic radical selected from aliphatic unsaturation-free, substituted or unsubstituted, monovalent hydrocarbon radicals having 1 to 30 carbon atoms, $$R^3_c R^4_d SiO_{(4-c-d)/2} \quad (2)$$

wherein c and d are positive numbers satisfying $0 \leq c < 3$, $0 < d \leq 3$ and $0 < c+d \leq 3$, $R^3$ is independently an organic radical selected from aliphatic unsaturation-free, substituted or unsubstituted, monovalent hydrocarbon radicals having 1 to 30 carbon atoms, and $R^4$ is an alkenyl radical,

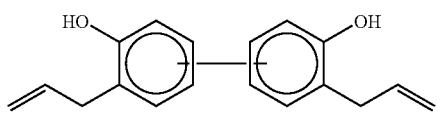

(3)

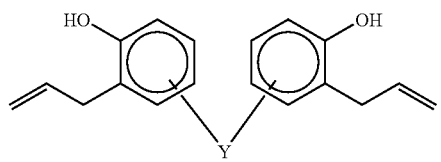

(4)

wherein

in formula (4) is